(12) United States Patent
Kim et al.

(10) Patent No.: US 8,252,879 B2
(45) Date of Patent: *Aug. 28, 2012

(54) PHOTOSENSITIVE RESIN, METHOD FOR PREPARING THE RESIN, PHOTOSENSITIVE RESIN COMPOSITION AND CURED PRODUCT OF THE RESIN COMPOSITION

(75) Inventors: Han Soo Kim, Daejeon (KR); Min Young Lim, Seongnam-si (KR); Sung Hyun Kim, Daejeon (KR); Yoon Hee Heo, Daejeon (KR); Dae Hyun Kim, Daejeon (KR); Ji Heum Yoo, Daejeon (KR); Sun Hwa Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 143 days.

This patent is subject to a terminal disclaimer.

(21) Appl. No.: 12/448,678

(22) PCT Filed: Aug. 20, 2008

(86) PCT No.: PCT/KR2008/004824
§ 371 (c)(1),
(2), (4) Date: Oct. 8, 2009

(87) PCT Pub. No.: WO2009/038290
PCT Pub. Date: Mar. 26, 2009

(65) Prior Publication Data
US 2010/0168266 A1 Jul. 1, 2010

(30) Foreign Application Priority Data
Sep. 19, 2007 (KR) .................. 10-2007-0095071

(51) Int. Cl.
*C08F 12/30* (2006.01)
*C08F 20/06* (2006.01)
*C08F 20/02* (2006.01)
*C08F 2/00* (2006.01)
*C08F 4/28* (2006.01)
*C08G 18/63* (2006.01)

(52) U.S. Cl. ............ 526/287; 526/310; 526/317.1; 526/318.2; 526/318.3; 526/222; 526/210; 526/227; 524/700; 522/100; 522/101; 522/102; 522/103; 522/104; 522/106; 522/107; 522/153; 522/150; 522/178; 522/179; 522/181; 522/182

(58) Field of Classification Search .................. 526/287, 526/310, 317.1, 318.2, 318.3, 222, 210, 227; 524/700; 522/100, 101, 102, 103, 104, 106, 522/107, 153, 150, 178, 179, 181, 182
See application file for complete search history.

(56) References Cited

U.S. PATENT DOCUMENTS

| 7,226,710 B2 | 6/2007 | Nishikubo et al. | |
| 2007/0259278 A1 | 11/2007 | Kura et al. | |
| 2008/0108726 A1* | 5/2008 | Guo et al. | 522/170 |
| 2010/0179294 A1* | 7/2010 | Kim et al. | 526/287 |

FOREIGN PATENT DOCUMENTS

| JP | 05070723 A | 3/1993 |
| JP | 2003002958 A | 1/2003 |

* cited by examiner

*Primary Examiner* — Sanza McClendon
(74) *Attorney, Agent, or Firm* — McKenna Long & Aldridge LLP

(57) ABSTRACT

Provided are a photosensitive resin and a photosensitive resin composition comprising the photosensitive resin. The photosensitive resin has the structure of Formula 1, which is described in the specification. The photosensitive resin and the photosensitive resin composition have good sensitivity, improved resistance to heat and chemicals, and excellent storage stability. Further provided are a method for preparing the photosensitive resin and a cured product of the photosensitive resin composition.

25 Claims, No Drawings

PHOTOSENSITIVE RESIN, METHOD FOR PREPARING THE RESIN, PHOTOSENSITIVE RESIN COMPOSITION AND CURED PRODUCT OF THE RESIN COMPOSITION

This application is a 35 U.S.C. §371 National Stage entry of International Application No. PCT/KR2008/004824, filed on Aug. 20, 2008, and claims the benefit of Korean Patent Application No. 10-2007-0095071 filed on Sep. 19, 2007, both of which are incorporated herein by reference in its entirety.

TECHNICAL FIELD

The present invention relates to a photosensitive resin, a method for preparing the photosensitive resin, a photosensitive resin composition, and a aired product of the photosensitive resin composition.

BACKGROUND ART

Photopolymerizable negative-type photosensitive resin compositions are used in various applications, including photosensitizers for the production of color filters, overcoat photosensitizers, column spacers, light-shielding insulating materials, etc.

A typical photosensitive resin composition can be used to form a pattern by the following procedure. First, the photosensitive resin composition is applied to a substrate to form a coating film. A particular portion of the coating film is exposed to radiation through a photomask, and then the unexposed portion is developed to form the desired pattern.

Great efforts are currently undertaken to achieve improved yield per unit time in the processes using photosensitive compositions despite reduced exposure dose and time. To this end, an improvement in the photosensitivity of the photosensitive compositions is needed.

A representative approach to increase the photosensitivity of a photosensitive composition is either to use a photoinitiator with high photosensitivity or to increase the amount of a photoinitiator used in the photosensitive composition. The former case has the problem that the photoinitiator with high photosensitivity is relatively expensive, and the latter case has the problem that large quantities of sublimable impurities are generated during post baking to contaminate an oven or materials (e.g., liquid crystal) and components provided within an LCD panel.

In an attempt to introduce photopolymerizable functional groups into side chains of an alkali-soluble resin used in a photosensitive composition, a method has been proposed for photocrosslinking the alkali-soluble resin with an ethylenically un-saturated compound.

As the proportion of the photopolymerizable functional groups introduced into the alkali-soluble resin increases, the photosensitivity of the photosensitive composition is improved. However, the photopolymerizable functional groups are also introduced into add groups of the alkali-soluble resin to reduce the relative proportion of the add groups remaining in the alkali-soluble resin, resulting in poor developability of the photosensitive composition.

Under these circumstances, many methods have been developed to meet both photo-sensitivity and developability required in photosensitive compositions. For example, an excessively large amount of a monomer having an add group is added to increase the proportion of add groups in an alkali-soluble resin, thereby maintaining the add value at a sufficiently high level even after a number of photopolymerizable functional groups are introduced in the subsequent step. However, the alkali-soluble resin having a high add value suffers from low solubility in a solvent commonly used to introduce the photopolymerizable functional groups. This low solubility induces precipitation of the alkali-soluble resin during polymerization to make it impossible to attain a desired molecular weight of the alkali-soluble resin. Further, the increased proportion of the monomer having an add group leads to a relatively low proportion of a monomer added to impart other coating characteristics of a film, causing damage to the intended characteristics of the film.

A highly polar solvent can be used during polymerization to increase the solubility of the alkali-soluble resin with a high add value in a solvent, but it tends to impair the dispersion stability of a color filter during subsequent processing.

Thus, there is a strong need for a photosensitive resin that is highly photosensitive and resistant to heat and chemicals.

DISCLOSURE OF INVENTION

Technical Problem

An object of the present invention is to provide a photosensitive resin with high photosensitivity and improved resistance to heat and chemicals.

Another object of the present invention is to provide a method for preparing the photosensitive resin.

Still another object of the present invention is to provide a photosensitive resin composition comprising the photosensitive resin.

Technical Solution

In accordance with an aspect of the present invention, there is provided a photo-sensitive resin represented by Formula 1:

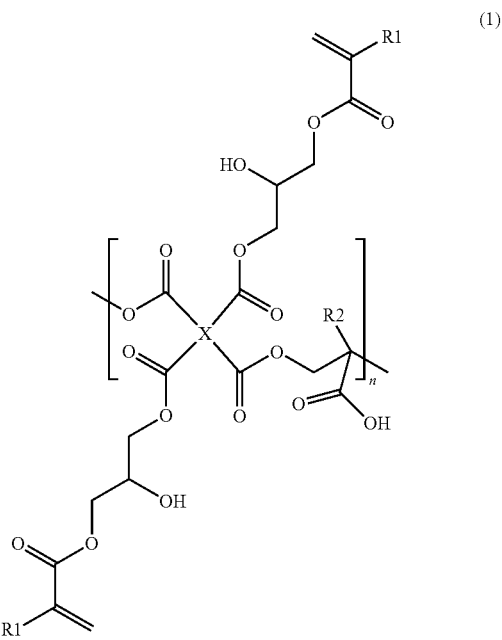

wherein X is a tetravalent group derived from a polybasic add anhydride, each $R_1$ is a hydrogen atom or a methyl group, and $R_2$ is selected from methyl and ethyl groups.

The photosensitive resin of Formula 1 may preferably be derived from a compound prepared by ring-opening polymerization of alcohol groups of a) a diol compound having an add group and b) a polybasic add anhydride.

The photosensitive resin may preferably have an add value of 30 to 200 KOH mg/g and a molecular weight of 1,000 to 200,000.

In accordance with another aspect of the present invention, there is provided a method for preparing a photosensitive resin, the method comprising the steps of: mixing a) a diol compound having an add group, b) a polybasic add anhydride and c) a solvent to prepare a first solution; heating the first solution; controlling the temperature of the first solution; and adding d) a compound having at least one ethylenically unsaturated group and at least one epoxy group in the molecule and e) a monohydric alcohol to the first solution, and stirring the mixture.

The diol compound a) may preferably have the structure of Formula 2:

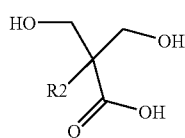

(2)

wherein R$_2$ is selected from methyl and ethyl groups.

The polybasic add anhydride b) may preferably be a compound having two add anhydride groups in one molecule.

The polybasic add anhydride b) may preferably be selected from 1,2,4,5-benzenetetracarboxylic dianhydride, 3,3',4,4'-benzophenonetetracarboxylic dianhydride, biphenyltetracarboxylic dianhydride, bis(3,4-dicarboxyphenyl)ether dianhydride, bis(3,4-dicarboxyphenyl)sulfide dianhydride, bis(3,4-dicarboxyphenyl)sulfone dianhydride, 1,4-bis(2,3-dicarboxyphenoxy)benzene dianhydride, 1,3-bis(3,4-dicarboxyphenoxy)benzene dianhydride, 2,3,6,7-naphthalenetetracarboxylic dianhydride, 4,4'-bis(3,4-dicarboxyphenoxy)diphenyl dianhydride, 4,4'-bis(3,4-dicarboxyphenoxy)diphenyl ether dianhydride, 4,4'-bis(3,4-dicarboxyphenoxy)diphenyl sulfone dianhydride, bis(3,4-dicarboxyphenyl)methane dianhydride, 1,1-bis(3,4-dicarboxyphenyl)ethane dianhydride, 1,2-bis(3,4-dicarboxyphenyl)ethane dianhydride, 2,2-bis(3,4-dicarboxyphenyl)propane dianhydride, 2,2-bis[4-(3,4-dicarboxyphenoxy)phenyl]propane dianhydride, 4-(2,3-dicarboxyphenoxy)-4'-(3,4-dicarboxyphenoxy)diphenyl-2,2-propane dianhydride, ethylene glycol ditrimellitate, 2,2-bis(3,4-dicarboxyphenyl)hexafluoropropane dianhydride, 1,3-bis(3,4-dicarboxyphenyl)hexafluoropropane dianhydride, 2,2-bis[4-(3,4-dicarboxyphenoxy)phenyl]hexafluoropropane dianhydride, 4,4'-bis[2-(3,4-dicarboxyphenyl)hexafluoroisopropyl]diphenyl ether dianhydride, and mixtures thereof.

The solvent c) may preferably be selected from methyl ethyl ketone, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, dipropylene glycol dimethyl ether, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, propyl cellosolve acetate, butyl cellosolve acetate, butyl acetate, and mixtures thereof.

The compound having at least one ethylenically unsaturated group and at least one epoxy group in the molecule d) may preferably be selected from glycidyl (meth)acrylate, allyl glycidyl ether, 3,4-epoxycyclohexylmethyl(meth)acrylate, glycidyl 5-norbornene-2-methyl-2-carboxylate (a mixture of endo- and exo-isomers), 1,2-epoxy-5-hexene, 1,2-epoxy-9-decene, and mixtures thereof.

The monohydric alcohol e) may preferably be a hydroxyl group-containing acrylate compound.

The solvent c) may preferably be present at least 10% to less than 100% by weight, based on the total weight of the mixing composition of the diol compound a), the polybasic add anhydride b) and the solvent c). The diol compound a) and the polybasic add anhydride b) may preferably be mixed together in a molar ratio of 1:0.3-1.1 in the mixing step, the first solution may preferably be heated at 80 to 130° C. for 4 to 24 hours in the heating step, the temperature may preferably be adjusted to 70 to 110° C. in the temperature controlling step, and the compound d) and the monohydric alcohol e) may preferably be added in a molar ratio of 1-2 and 0.05-0.5 to the diol compound a) separately, and stirred for 4 to 24 hours in the stirring step.

Preferably, a thermal polymerization inhibitor may be further added in the stirring step.

In accordance with another aspect of the present invention, there is provided a photo-sensitive resin composition comprising the photosensitive resin of Formula 1, f) a polymerizable compound having at least one ethylenically unsaturated bond g) a photopolymerization initiator, and h) a solvent.

The polymerizable compound f) may preferably be selected from: compounds prepared by esterifying at least one polyhydric alcohol selected from ethylene glycol di(meth)acrylate, polyethylene glycol di(meth)acrylate having 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethylphthalic add, propylene glycol di(meth)acrylate having 2 to 14 propylene groups, dipentaerythritol penta(meth)acrylate and dipentaerythritol hexa(meth)acrylate with an α,β-unsaturated carboxylic acid; compounds prepared by adding (meth)acrylic acid to at least one glycidyl group-containing compound selected from trimethylolpropane triglycidyl ether acrylic add adducts and bisphenol A diglycidyl ether acrylic add adducts; ester compounds obtained from a compound having a hydroxyl group or an ethylenically unsaturated bond and a polyhydric-carboxylic add, and adducts of a compound having a hydroxyl group or an ethyl-enically unsaturated bond with polyisocyanate, such as phthalic add diester of β-hydroxyethyl(meth)acrylate and adduct of β-hydroxyethyl(meth)acrylate with toluene diisocyanate; ester compounds obtained from a compound having a hydroxyl group or an ethylenically unsaturated bond and a polyhydriccarboxylic add, and adducts of a compound having a hydroxyl group or an ethylenically unsaturated bond with poly-isocyanate, such as phthalic add diester of 3-hydroxyethyl(meth)acrylate and adduct of β-hydroxyethyl(meth)acrylate with toluene diisocyanate; alkyl (meth)acrylic add esters, such as methyl(meth)acrylate, ethyl (meth)acrylate, butyl(meth)acrylate and 2-ethylhexyl(meth)acrylate; 9,9'-bis[4-(2-acryloyloxyethoxy)phenyl]fluorene; and mixtures thereof.

The photopolymerization initiator g) may preferably be selected from triazine compounds, biimidazole compounds, acetophenone compounds, O-acyloxime compounds, benzophenone compounds, thioxanthone compounds, phosphine oxide compounds, coumarin compounds, and mixtures thereof.

The solvent h) may preferably be selected from methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxy propanol, 3-methoxy butanol, cyclohexanone, cyclopentanone, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, and mixtures thereof.

The photosensitive resin composition of the present invention may further comprise at least one additive selected from alkali-soluble acrylic copolymer resins, photo-sensitizers, colorants, curing accelerators, thermal polymerization inhibitors, plasticizers, adhesion promoters, fillers, and surfactants.

The photosensitive resin composition may preferably comprise 1 to 20% by weight of the photosensitive resin, 0.5 to 30% by weight of the polymerizable compound f), 0.1 to 5% by weight of the photopolymerization initiator g) and 10 to 95% by weight of the solvent h), based on the total weight of the composition.

In accordance with yet another aspect of the present invention, there is provided a cured product of the photosensitive resin composition.

Advantageous Effects

The photosensitive resin and the photosensitive resin composition according to the present invention are highly photosensitive and resistant to heat and chemicals. In addition, the photosensitive resin and the photosensitive resin composition are very stable during storage. Therefore, the photosensitive resin and the photosensitive resin composition are easy to store and storable for a long period of time.

BEST MODE FOR CARRYING OUT THE INVENTION

The present invention provides a photosensitive resin represented by Formula 1:

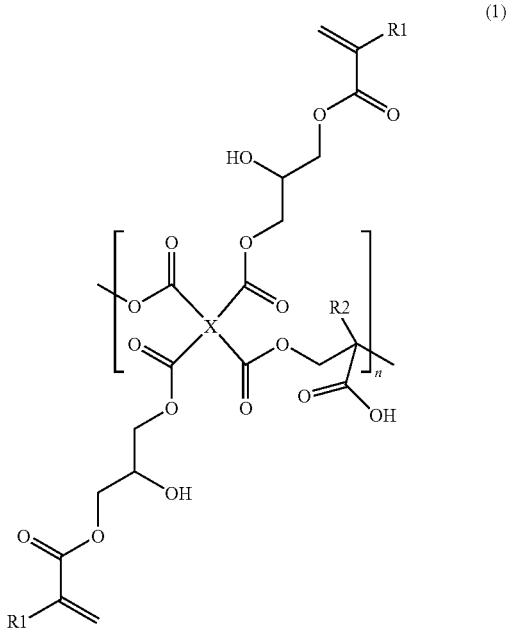

wherein X is a tetravalent group derived from a polybasic acid anhydride, each $R_1$ is a hydrogen atom or a methyl group, and $R_2$ is selected from methyl and ethyl groups.

The photosensitive resin of the present invention is prepared by mixing a) a diol compound having an acid group with b) a polybasic acid anhydride in c) a solvent, heating the mixture in the absence or presence of tetrabutylammonium bromide as a reaction catalyst to prepare a polyester resin of Formula 3:

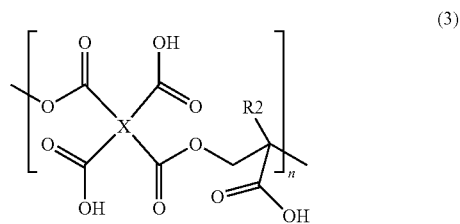

wherein X is a tetravalent group derived from the polybasic acid anhydride b) and $R_2$ is a methyl or ethyl group, and adding d) a compound having at least one ethylenically unsaturated group and at least one epoxy group in the molecule and e) a monohydric alcohol to the polyester resin, followed by stirring.

The monohydric alcohol e) is a compound that converts unreacted anhydride groups of the component b) remaining in the solution after polycondensation of the components a) and b) or anhydride groups remaining at the terminals of the resin (Formula 3) to ester and carboxyl groups by ring opening. That is, the monohydric alcohol e) functions to remove the highly reactive anhydride groups to enhance the storage stability of the photosensitive resin.

The structure of the diol compound a) may be represented by Formula 2:

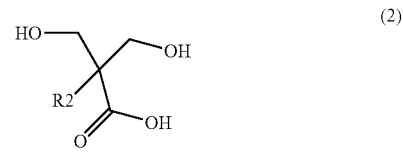

wherein $R_2$ is a methyl or ethyl group.

The polybasic acid anhydride b) is a compound that has two acid anhydride groups capable of alternating copolymerization with the diol compound a) in one molecule.

The polybasic acid anhydride b) can be selected from, but not limited to, 1,2,4,5-benzenetetracarboxylic dianhydride, 3,3',4,4'-benzophenonetetracarboxylic dianhydride, biphenyltetracarboxylic dianhydride, bis(3,4-dicarboxyphenyl) ether dianhydride, bis(3,4-dicarboxyphenyl)sulfide dianhydride, bis(3,4-dicarboxyphenyl)sulfone dianhydride, 1,4-bis (2,3-dicarboxyphenoxy)benzene dianhydride, 1,3-bis(3,4-dicarboxyphenoxy)benzene dianhydride, 2,3,6,7-naphthalenetetracarboxylic dianhydride, 4,4'-bis(3,4-dicarboxyphenoxy)diphenyl dianhydride, 4,4'-bis(3,4-dicarboxyphenoxy)diphenyl ether dianhydride, 4,4'-bis(3,4-dicarboxyphenoxy)diphenyl sulfone dianhydride, bis(3,4-dicarboxyphenyl)methane dianhydride, 1,1-bis(3,4-dicarboxyphenyl)ethane dianhydride, 1,2-bis(3,4-dicarboxyphenyl)ethane dianhydride, 2,2-bis(3,4-dicarboxyphenyl)propane dianhydride, 2,2-bis[4-(3,4-dicarboxyphenoxy)phenyl]propane dianhydride, 4-(2,3- dicarboxyphenoxy)-4'-(3,4-dicarboxyphenoxy)diphenyl-2,2-propane dianhydride, ethylene glycol ditrimellitate, 2,2-bis(3,4-dicarboxyphenyl)hexafluoropropane dianhydride, 1,3-bis(3,4-dicarboxyphenyl)hexafluoropropane dianhydride, 2,2-bis[4-(3,4-dicarboxyphenoxy)phenyl]hexafluoropropane dianhydride, and 4,4'-bis[2-(3,4-dicarboxyphenyl)hexafluoroisopropyl]diphenyl ether dianhydride. These polybasic add anhydrides may be used alone or as a mixture of two or more thereof.

The solvent c) can be selected from methyl ethyl ketone, ethylene glycol dimethyl ether, ethylene glycol diethyl ether, propylene glycol dimethyl ether, propylene glycol diethyl ether, diethylene glycol dimethyl ether, diethylene glycol diethyl ether, di-ethylene glycol methyl ethyl ether, dipropylene glycol dimethyl ether, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl cellosolve acetate, and butyl acetate. These solvents may be used alone or as a mixture of two or more thereof. The kind of the solvent c) is not particularly limited so long as the solvent c) contains no alcohol group and has a sufficiently high boiling point so as not to be readily evaporated at the polycondensation temperature.

The diol compound a) and the polybasic acid anhydride b) are preferably mixed together in a molar ratio of 1:0.3-1.1. If the proportion of the polybasic add anhydride b) is less than the lower limit (i.e. 1:0.3), the molecular weight of the resin is lowered. As a result, the resin cannot sufficiently perform its function as a binder polymer to bind other constituent components, is unable to withstand an external physical force during development, resulting in loss of a pattern, and exhibits unsatisfactory physical properties in terms of heat resistance and chemical resistance. Meanwhile, if the proportion of the polybasic add anhydride b) is more than the upper limit (i.e. 1:1.1), the molecular weight of the resin is increased. As a result, the resin becomes viscous, which may lead to poor processability.

The mixture of the diol compound a) and the polybasic add anhydride b) is heated at 80 to 130° C. for 4 to 24 hours. After the temperature is adjusted to 70 to 110° C., the compound d) and the monohydric alcohol e) are added and stirred for 4 to 24 hours. At this time, the molar ratio of the compound d) and the monohydric alcohol e) to the diol compound a) are preferably 1-2 and 0.05-0.5 separately.

The photosensitive resin of the present invention is distinguished from known poly-condensation resins in that the monohydric alcohol is additionally reacted to remove remaining anhydride groups. The removal of remaining anhydride groups improves the storage stability of the resin, making the photosensitive resin easy to store and storable for a long period of time.

The compound d) can be selected from glycidyl(meth)acrylate, allyl glycidyl ether, 3,4-epoxycyclohexylmethyl (meth)acrylate, glycidyl 5-norbornene-2-methyl-2-carboxylate (a mixture of endo- and exo-isomers), 1,2-epoxy-5-hexene, and 1,2-epoxy-9-decene. These compounds may be used alone or as a mixture of two or more thereof.

It is preferred to use the monohydric alcohol e) in a much larger amount than the amount of carboxylic anhydride groups remaining in the photosensitive resin solution. The monohydric alcohol e) is preferably used in an amount of 5 to 50 mole % with respect to the total moles of the diol compound a) and the monohydric alcohol (e).

If the monohydric alcohol has a boiling point lower than the reaction temperature, a considerably large amount of the monohydric alcohol is likely to be volatile as the reaction proceeds, causing non-uniform quality of the final photosensitive resin. Therefore, the boiling point of the monohydric alcohol is preferably higher than the reaction temperature. A hydroxyl group-containing acrylate compound is particularly preferred because a portion of the monohydric alcohol remaining after the reaction can participate in photocrosslinking during subsequent processing.

A thermal polymerization inhibitor may be further added in the stirring step. The thermal polymerization inhibitor plays a role in preventing ethylene groups, which are introduced by polycondensation at the reaction temperature of the photosensitive resin components, from inducing gelling through thermal polymerization. The thermal polymerization inhibitor can be used in the presence of oxygen. The thermal polymerization inhibitor can be selected from, but not limited to 4-methoxyphenol (MEHQ) or 2,6-di-t-butyl-4-methylphenol.

A catalyst may be further added during preparation of the photosensitive resin. As the catalyst, there can be used a base catalyst, for example, an alkyl ammonium salt, triphenylphosphine, triphenylantimony or dimethylaminopyridine.

The photosensitive resin of Formula 1 according to the present invention preferably has an add value of 30 to 200 KOH mg/g. An add value lower than 30 results in low solubility of the photosensitive resin in an alkaline developing solution, thus causing long developing time and increasing the risk that residue may be left on a substrate. Meanwhile, an add value higher than 200 causes undesirable detachment and non-rectilinearity of a pattern and results in the formation of a reverse-tapered or T-top shaped pattern whose taper angle is larger than 90° during subsequent processing.

The weight average molecular weight of the photosensitive resin is preferably in the range of 1,000 to 200,000 and more preferably 3,000 to 30,000.

The photosensitive resin having a weight average molecular weight of less than 1,000 cannot sufficiently perform its function as a binder polymer to bind other constituent components and is unable to withstand an external physical force during development, resulting in loss of a pattern. In addition, fundamental physical properties (e.g., heat resistance and chemical resistance) required in a color filter pattern are unsatisfactory.

Meanwhile, the photosensitive resin having a weight average molecular weight of more than 200,000 is not substantially developable with an alkaline developing solution, resulting in poor development processability. In an extreme case, the photo-sensitive resin cannot be developed and is poorly flowable, making it difficult to control coating thickness and ensure thickness uniformity.

The present invention also provides a photosensitive resin composition comprising the photosensitive resin of Formula 1, f) a polymerizable compound having at least one ethylenically unsaturated bond, g) a photopolymerization initiator, and h) a solvent. The photosensitive resin composition of the present invention can be used in various applications, including photosensitizers for the production of color filters, overcoat photosensitizers, column spacers, light-shielding insulating materials, etc.

The photosensitive resin is present in an amount of 1 to 20% by weight, based on the total weight of the photosensitive resin composition. If the content of the photosensitive resin is less than 1% by weight or more than 20% by weight, the viscosity of the composition is too low or too high, which makes it difficult to keep the uniformity of a final coating film.

Any polymerizable compound known in the art may be used as the component f), and non-limiting examples thereof include: compounds prepared by esterifying at least one polyhydric alcohol selected from ethylene glycol di(meth)acrylate, polyethylene glycol di(meth)acrylate having 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethylphthalic add, propylene glycol di(meth)acrylate having 2 to 14 propylene groups, dipentaerythritol penta(meth)acrylate and dipentaerythritol hexa(meth)acrylate with an α,β-unsaturated carboxylic add; compounds prepared by adding (meth)acrylic add to at least one glycidyl group-containing compound selected from trimethylolpropane triglycidyl ether acrylic add adducts and bisphenol A diglycidyl ether acrylic add adducts; ester compounds obtained from a compound having a hydroxyl group or an ethylenically unsaturated bond and a polyhydric-carboxylic add, and adducts of a compound having a hydroxyl group or an ethyl-enically unsaturated bond with polyisocyanate, such as phthalic add diester of β-hydroxyethyl(meth)acrylate and adduct of β-hydroxyethyl(meth)acrylate with toluene diisocyanate; ester compounds obtained from a compound having a hydroxyl group or an ethylenically unsaturated bond and a polyhydriccarboxylic add, and adducts of a compound having a hydroxyl group or an ethylenically unsaturated bond with polyisocyanate, such as phthalic add diester of β-hydroxyethyl(meth)acrylate and adduct of β-hydroxyethyl(meth)acrylate with toluene diisocyanate; alkyl(meth)acrylic add esters, such as methyl(meth)acrylate, ethyl(meth)acrylate, butyl(meth)acrylate and 2-ethylhexyl(meth)acrylate; 9,9'-bis[4-(2-acryloyloxyethoxy)phenyl]fluorene; and mixtures thereof. If needed, these polymerizable compounds may contain a silica dispersion. Commercially available silica dispersions suitable for use in the present invention are Nanocryl XP series 0596, 1045 and 21/1364 and Nanopox XP series 0516 and 0525, all of which are sold by Hanse Chemie GmbH.

The polymerizable compound f) is preferably present in an amount of 0.5 to 30% by weight, based on the total weight of the photosensitive resin composition. The use of the polymerizable compound f) in an amount of less than 0.5% by weight causes a reduction in the strength of a final pattern. Meanwhile, the use of the polymerizable compound f) in an amount of more than 30% by weight causes an excessive increase in the tackiness of a resin layer, and as a result, impurities are likely to be attached to the layer.

Non-limiting examples of the photopolymerization initiator g) include: triazine compounds, such as 2,4-trichloromethyl-(4'-methoxyphenyl)-6-triazine, 2,4-trichloromethyl-(4'-methoxystyryl)-6-triazine, 2,4-trichloromethyl-(piperonyl)-6-triazine, 2,4-trichloromethyl-(3',4'-dimethoxyphenyl)-6-triazine, and 3-{4-[2,4-bis(trichloromethyl)-s-triazin-6-yl]phenylthio}propanoic add; biimidazole compounds, such as 2,2'-bis(2-chlorophenyl)-4,4',5,5'-tetraphenylbiimidazole and 2,2'-bis(2,3-dichlorophenyl)-4,4',5,5'-tetraphenylbiimidazole; acetophenone compounds, such as 2-hydroxy-2-methyl-1-phenylpropan-1-one, 1-(4-isopropylphenyl)-2-hydroxy-2-methylpropan-1-one, 4-(2-hydroxyethoxy)-phenyl (2-hydroxy)propyl ketone, 1-hydroxycyclohexyl phenyl ketone, 2,2-dimethoxy-2-phenyl acetophenone, 2-methyl-(4-methylthiophenyl)-2-morpholino-1-propan-1-one (Irgacure-907) and 2-benzyl-2-dimethylamino-1-(4-morpholinophenyl)-butan-1-one (Irgacure-369); O-acyloxime compounds, such as Irgacure OXE 01 (Ciba Geigy) and Irgacure OXE 02 (Ciba Geigy); benzophenone compounds, such as 4,4'-bis(dimethylamino)benzophenone and 4,4'-bis(diethylamino)benzophenone; thioxanthone compounds, such as 2,4-diethylthioxanthone, 2-chlorothioxanthone, isopropylthioxanthone and diisopropylthioxanthone; phosphine oxide compounds, such as 2,4,6-trimethylbenzoyldiphenylphosphine oxide, bis(2,6-dimethoxybenzoyl)-2,4,4-trimethylpentylphosphine oxide and bis(2,6-dichlorobenzoyl)propylphosphine oxide; and coumarin compounds, such as 3,3'-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin, 10,10'-carbonylbis[1,1,7,7-tetramethyl-2,3,6,7-tetrahydro-1H,5H,11H—Cl]-benzopyroano[6,7,8-ij]-quinolizin-11-one.

The photopolymerization initiator g) is preferably present in an amount of 0.1 to 5% by weight, based on the total weight of the photosensitive resin composition. If the content of the photopolymerization initiator is less than 0.1% by weight, the polymerizable compound f) does not sufficiently participate in curing. Meanwhile, if the content of the photopolymerization initiator is more than 5% by weight, radicals that do not participate in curing may cause contamination of the composition.

Non-limiting examples of the solvent h) include methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxy propanol, 3-methoxy butanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, and mixtures thereof.

The solvent h) is preferably present in an amount of 10 to 95% by weight, based on the total weight of the photosensitive resin composition.

Optionally, the photosensitive resin composition may further comprise at least one additive selected from alkali-soluble acrylic copolymer resins, photosensitizers, colorants, curing accelerators, thermal polymerization inhibitors, plasticizers, adhesion promoters, fillers, and surfactants.

The colorants may be pigments, dyes and mixtures thereof. As black pigments, there may be exemplified carbon black, graphite and metal oxides (e.g., titanium black). Commercially available carbon black products are, for example: SEAST 5HIISAF-HS, SEAST KH, EAST 3HHAF-HS, SEAST NH, SEAST 3M, SEAST 300HAF-LS, SEAST 116HMMAF-HS, SEAST 116MAF, SEASTF MFEF-HS, SEAST SOFEF, SEAST VGPF, SEAST SVHSRF-HS and SEAST SSRF, all of which are sold by Tokai Carbon Co., Ltd.; DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA 11, MA100, MA40, OIL7B, OIL9B, OIL11B, OIL30B and OIL31B, all of which are sold by Mitsubishi Chemical Corp.; PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100 and LAMP BLACK-101, all of which are sold by Degussa; RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA and RAVEN-1170, all of which are sold by Colombia Carbon Co.; and mixtures thereof.

Colorants that can produce colors other than black, for example: Carmine 6B (C.I.12490); Phthalocyanine Green (C.I. 74260); Phthalocyanine Blue (C.I. 74160); Perylene Black (BASF K0084 and K0086); Cyanine Black; Lionol Yellow (C.I.21090); Lionol Yellow GRO (CI. 21090); Benzidine Yellow 4T-564D; Victoria Pure Blue (C.I.42595); C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264 and 272; C.I. PIGMENT GREEN 7 and 36; C.I. PIGMENT BLUE 15:1, 15:3, 15:4, 15:6, 16, 22, 28, 36, 60 and 64; C.I. PIGMENT YELLOW 13, 14, 35, 53, 83, 93, 95, 110, 120, 138, 139, 150, 151, 154, 175, 180, 181, 185, 194 and 213; and C.I. PIGMENT VIOLET 15, 19, 23, 29, 32 and 37. White and fluorescent pigments may also be used.

Any curing accelerator known in the art may be used in the present invention, and examples thereof include, but are not limited to, 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate), and trimethylolethane tris(3-mercaptopropionate). These curing accelerators may be used alone or as a mixture of two or more thereof.

Any thermal polymerization inhibitor known in the art may be used in the present invention, and examples thereof include, but are not limited to, p-anisole, hydroquinone, pyrocatechol, t-butylcatechol, N-nitrosophenylhydroxyamine ammonium salt, N-nitrosophenylhydroxyamine aluminum salt and phenothiazine. These thermal polymerization inhibitors may be used alone or as a mixture of two or more thereof.

Plasticizers, adhesion promoters, fillers and surfactants that may be used in conventional photosensitive resin compositions can be used in the present invention.

Preferably, the photosensitive resin composition comprises 0.5 to 20% by weight of a colorant and 0.01 to 10% by weight of other additives, based on the total weight of the composition.

The present invention also provides a cured product of the photosensitive resin composition.

The photosensitive resin composition of the present invention can be applied to a suitable support such as a metal, paper, glass or plastic substrate by any suitable process such as roll coating, curtain coating, spin coating slot die coating printing or dipping. After the photosensitive resin composition is applied to a support (e.g., a film), the coating can be transferred to another support. There is no particular restriction on the application method of the photosensitive resin composition.

The photosensitive resin composition can be cured under a suitable light source, for example, a mercury vapor, carbon or xenon (Xe) arc that emits light having a wavelength of 250 to 450 nm.

MODE FOR THE INVENTION

Hereinafter, the present invention will be explained in more detail with reference to the following examples. However, these examples are given only for the purpose of illustration and are not intended to limit the scope of the invention.

Synthesis Examples 1-3

Preparation of Photosensitive Resins

Synthesis Example 1

90 g of ethylene glycol ditrimellitate, 40 g of 2,2-bis(hydroxymethyl)propionic acid, 2 g of tetrabutylammonium bromide and 370 g of PGMEA were stirred using a mechanical agitator in a one-liter reactor. The reactor was heated to 115° C. under a stream of nitrogen gas. The heating was continued for 10 hours to obtain a solution of a polyester resin (solids content=25%). To the polyester resin solution were added 54 g of glycidyl methacrylate, 3 g of hydroxyethyl acrylate and 0.1 g of 2,6-t-butyl-4-methylphenol. The mixture was allowed to react at 115° C. for 12 hours to afford a solution of a photosensitive resin 1. The photosensitive resin was found to have an acrylate equivalent weight of 55 mole %, a solids content of 38.6%, an acid value of 111 and a molecular weight of 9,440.

Synthesis Example 2

50 g of glycidyl methacrylate, 2.5 g of hydroxyethyl methacrylate and 0.1 g of 2,6-t-butyl-4-methylphenol were added to 500 g of the polyester resin solution 1 obtained in Synthesis Example 1. The mixture was allowed to react at 115° C. for 12 hours to afford a solution of a photosensitive resin 2. The photosensitive resin was found to have an acrylate equivalent weight of 55 mole %, a solids content of 37.58%, an add value of 99 and a molecular weight of 12,420.

Synthesis Example 3

80 g of biphenyltetracarboxylic add dianhydride, 45 g of 2,2-bis(hydroxymethyl)propionic add, 2.5 g of tetrabutylammonium bromide and 370 g of PGMEA were stirred using a mechanical agitator in a one-liter reactor. The reactor was heated to 115° C. under a stream of nitrogen gas. The heating was continued for 10 hours to obtain a solution of a polyester resin (solids content=25%). To the polyester resin solution were added 70 g of glycidyl methacrylate, 3.1 g of hydroxyethyl acrylate and 0.1 g of 2,6-t-butyl-4-methylphenol. The mixture was allowed to react at 115° C. for 12 hours to afford a solution of a photosensitive resin 3. The photosensitive resin was found to have an acrylate equivalent weight of 58 mole %, a solids content of 32.67%, an acid value of 106 and a molecular weight of 25,000.

Comparative Synthesis Example 1

2.67 kg of benzyl methacrylate, 1.9 kg of methacrylic add, 120 g of dodecanethiol and 12.5 kg of PGMEA as a solvent were mixed together using a mechanical agitator under a nitrogen atmosphere for 30 minutes. The reactor was heated to 70° C. under a nitrogen atmosphere. When the temperature of the mixture reached 70° C., 120 g of AIBN as a thermal polymerization initiator was added. The resulting mixture was stirred for 8 hours. After the temperature of the reactor was raised to 90° C., 10 g of triphenylphosphine and 5 g of MEHQ as a thermal polymerization inhibitor were added to the reactor. The mixture was stirred for 30 minutes, and 1.6 kg of glycidyl methacrylate was added thereto. The reactor was heated to 110° C. under atmospheric air. Stirring was continued for 12 hours to afford a desired resin (acrylate equivalent weight=30 mole %, weight average molecular weight=13,000 and add value=94).

Examples 1-3

Preparation of Photosensitive Resin Compositions

Example 1

35 g of a 25% dispersion of carbon black, 13.4 g of the photosensitive resin prepared in Synthesis Example 1, 3.5 g of dipentaerythritol hexaacrylate as a polymerizable compound 2.5 g of a photopolymerization initiator (Irgacure WE 02), 1 g of 3-{4-[2,4-bis(trichloromethyl)-s-triazin-6-yl]phenylthio}propanoic add, 0.5 g of 4,4'-diethylaminobenzophenone and 44.5 g of PGMEA as an organic solvent were mixed together for 3 hours to give a photosensitive resin composition.

Example 2

35 g of a 25% dispersion of carbon black, 11.7 g of the photosensitive resin prepared in Synthesis Example 2, 3.5 g of dipentaerythritol hexaacrylate as a polymerizable compound, 2.5 g of a photopolymerization initiator (Irgacure WE 02), 1 g of 3-{4-[2,4-bis(trichloromethyl)-s-triazin-6-yl]phenylthio}propanoic add, 0.5 g of 4,4'-diethylaminobenzophenone and 45.8 g of PGMEA as an organic solvent were mixed together for 3 hours to give a photosensitive resin composition.

Example 3

35 g of a 25% dispersion of carbon black, 13.0 g of the photosensitive resin prepared in Synthesis Example 3, 3.5 g of dipentaerythritol hexaacrylate as a polymerizable compound, 2.5 g of a photopolymerization initiator (Irgacure WE 02), 1 g of 3-{4-[2,4-bis(trichloromethyl)-s-triazin-6-yl]phenylthio}propanoic add, 0.5 g of 4,4'-diethylaminobenzophenone and 48.75 g of PGMEA as an organic solvent were mixed together for 3 hours to give a photosensitive resin composition.

Comparative Example 1

A photosensitive resin composition was prepared in the same manner as in Example 1 except that 14.5 g of the photosensitive resin prepared in Comparative Synthesis Example 1 was used.

Experimental Example 1

Evaluation of Molecular Weight Stability

The molecular weights of the photosensitive resin compositions prepared in Examples 1-3 and Comparative Example 1 were measured by gel permeation chromatography (GPC) within 24 hours after preparation ('Initial molecular weights'). Each of the resin compositions was divided into two equal parts. The samples were separately stored at room temperature (20° C.) and a high temperature (45° C.). Seven days after preparation, the molecular weights of the samples were measured and compared with the initial values. Particularly, the molecular weight stability of the sample was judged to be 'excellent', 'good' and 'poor' when the molecular weight of the sample was increased by less than 5%, 5-10% and more than 10% in the high-temperature acceleration test, respectively. The results are shown in Table 1.

TABLE 1

| Sample | | Initial molecular weight | Molecular weight after storage for 7 days | Increment (%) | Evaluation |
|---|---|---|---|---|---|
| Example 1 | 20° C. | 9,440 | 9,530 | 1.0 | Excellent |
| | 45° C. | | 9,680 | 2.5 | |
| Example 2 | 20° C. | 12,420 | 12,560 | 1.1 | Excellent |
| | 45° C. | | 12,920 | 4.0 | |
| Example 3 | 20° C. | 25,000 | 25,700 | 2.8 | Excellent |
| | 45° C. | | 26,100 | 4.4 | |
| Comparative Example 1 | 20° C. | 13,000 | 13,100 | 0.8 | Good |
| | 45° C. | | 5,100 | 9.5 | |

The results in Table 1 reveal that the photosensitive resins of Examples 1-3 were very stable during storage at room temperature (20° C.) and high temperature (45° C.), indicating that the photosensitive resins were easy to store and storable for a long period of time. It should be understood that the effects of the invention are not limited to the storage temperatures.

Evaluation on Sensitivity and Chemical Resistance of the Photosensitive Resin Compositions The photosensitive resin compositions of Examples 1-3 and Comparative Example 1 were tested for sensitivity and chemical resistance by the following procedures.

First, each of the compositions was spin-coated on glass and pre-baked at about 100° C. for 90 seconds to form a film. The film was exposed to light through a photomask under a high-pressure mercury lamp with an exposure energy of 100 mJ/cm2, developed with an aqueous alkaline solution of KOH (pH 11.3-11.7) at regular time intervals, washed with deionized water, and post-baked at 220° C. for about 30 minutes to produce a black matrix photosensitizer.

The size of the smallest pixel of the pixels remaining after exposure and development was measured using a line & space mask to determine the sensitivity of the photo-sensitive resin composition.

A difference in the thickness of the photosensitizer before and after the black matrix photosensitizer was dipped in N-methylpyrrolidone (NMP) at 60° C. for 3 minutes was measured to determine the chemical resistance of the photosensitive resin composition.

The results are shown in Table 2.

TABLE 2

| Results obtained when the compositions were applied to black matrix photo-sensitizers | | |
|---|---|---|
| Composition | The smallest pixel size (μm) | Thickness difference (%) |
| Example 1 | 5 | 2.5 |
| Example 2 | 5 | 1.8 |
| Example 3 | 5 | 2.6 |
| Comparative Example 1 | 10 | 3.0 |

As can be seen from the results in Table 2, the sizes of the smallest pixels remaining after development of the compositions of Examples 1-3 and Comparative Example 1 were 5, 5, 5 and 10 μm, indicating better sensitivity of the compositions of Examples 1-3 than the composition of Comparative Example 1. Further, the thickness changes of the black matrix photosensitizers produced using the compositions of Examples 1-3 and Comparative Example 1 before and after dipping in NMP for 3 minutes were from 2.5, 1.8, 2.6 and 3.0%, demonstrating better chemical resistance of the compositions of Examples 1-3 than the composition of Comparative Example 1.

The invention claimed is:

1. A photosensitive resin represented by Formula 1

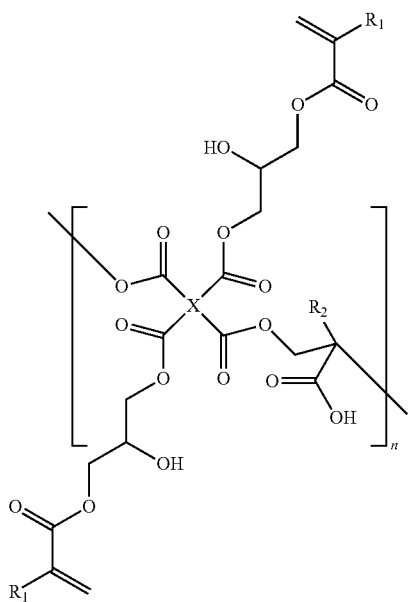

(1)

wherein X is a tetravalent group derived from a polybasic acid anhydride, each $R_1$ is a hydrogen atom or a methyl group, and $R_2$ is selected from methyl and ethyl groups.

2. The photosensitive resin according to claim 1, wherein the photosensitive resin of Formula 1 is derived from a compound prepared by ring-opening polymerization of alcohol groups of a) a diol compound having an acid group and b) a polybasic acid anhydride.

3. The photosensitive resin according to claim 1, wherein the photosensitive resin has an acid value of 30, to 200 KOH mg/g and a molecular weight of 1,000 to 200,000.

4. A method for preparing a photosensitive resin, the method comprising the steps of:
mixing a) a diol compound having an acid group, b) a polybasic acid anhydride and c) solvent to prepare a first solution;
heating the first solution;
controlling the temperature of the first solution; and
adding d) a compound having at least one ethylenically unsaturated group and at least one epoxy group in the molecule and e) a monohydric alcohol to the first solution, and stirring the mixture.

5. The method according to claim 4, wherein the diol compound a) has the structure of Formula 2:

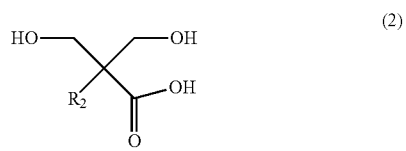

(2)

wherein $R_2$ is selected from methyl and ethyl groups.

6. The method according to claim 4, wherein the polybasic acid anhydride b) is a compound having two acid anhydride groups in one molecule.

7. The method according to claim 4, wherein the polybasic acid anhydride b) is selected from 1,2,4,5-benzenetetracarboxylic dianhydride, 3,3',4,4'-benzophenonetetracarboxylic dianhydride, biphenyltetracarboxylic dianhydride, bis(3,4-dicarboxyphenyl)ether dianhydride, bis(3,4-dicarboxyphenyl)sulfide dianhydride, bis(3,4-dicarboxyphenyl)sulfone dianhydride, 1,4-bis(2,3-dicarboxyphenoxy)benzene dianhydride, 1 bis(3,4-dicarboxyphenoxy)benzene dianhydride, 2,3,6,7-naphthalenetetracarboxylic dianhydride, 4,4'-bis(3,4-dicarboxyphenoxy)diphenyl dianhydride, 4,4'-bis(3,4-dicarboxyphenoxy)diphenyl ether dianhydride, 4,4'-bis(3,4-dicarboxyphenoxy)diphenyl sulfone dianhydride, his (3,4-dicarboxyphenyl)methane dianhydride, 1,1-bis(3,4-dicarboxyphenyl)ethane dianhydride, 1,2-bis(3,4-dicarboxyphenyl)ethane dianhydride, 2,2-bis(3,4-dicarboxyphenyl)propane dianhydride, 2,2-bis[4-(3,4-dicarboxyphenoxy)phenyl]propane dianhydride, 4-(2,3-dicarboxyphenoxy)-4%-(3,4-dicarboxyphenoxy)diphenyl-2,2-propane dianhydride, ethylene glycol ditrimellitate, 2,2-bis(3,4-dicarboxyphenyl)hexafluoropropane dianhydride, 1,3-bis(3,4-dicarboxyphenyl)hexafluoropropane dianhydride, 2,2-bis[4-(3,4-dicarboxyphenoxy)phenyl]hexafluoropropane dianhydride, 4,4'-bis[2-(3,4-dicarboxyphenyl)hexafluoroisopropyl]diphenyl ether dianhydride, and mixtures thereof.

8. The method according to claim 4, wherein the solvent c) is selected from methyl ethyl ketone, ethylene glycol dimethyl ether, ethylene glycol diethyl ether, propylene glycol dimethyl ether, propylene glycol diethyl ether, diethylene glycol dimethyl ether, diethylene glycol dimethyl ether, diethylene glycol methyl ethyl ether, dipropylene glycol dimethyl ether, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl cellosolve acetate, butyl acetate, and mixtures thereof.

9. The method according to claim 4, wherein the compound d) is selected from glycidyl (meth)acrylate, allyl glycidyl ether, 3,4-epoxycyclohexylmethyl (meth)acrylate, glycidyl 5-norbornene-2-methyl-2-carboxylate (a mixture of endo- and exo-isomers),1,2-epoxy-5-hexene, 1,2-epoxy-9-decene and mixtures thereof.

10. The method according to claim 4, wherein the monohydric alcohol e) is a hydroxyl group-containing acrylate compound.

11. The method according to claim 4, wherein the solvent c) is present at least 10% to less than 100% by weight, based on the total weight of the mixing composition of the diol compound a), the polybasic acid anhydride b) and the solvent c).

12. The method according to claim 4, wherein the diol compound a) and the polybasic acid anhydride b) are mixed together in a molar ratio of 1:0.3-1.1 in the mixing step, the first solution is heated at 80 to 130° C. for 4 to 24 hours in the heating step, the temperature is adjusted to 70 to 110° C. in the temperature controlling step, and the compound d) and the monohydric alcohol e) are added in a molar ratio of 1-2 and 0.05-0.5 to the diol compound a) separately, and stirred for 4 to 24 hours in the stirring step.

13. The method according to claim 4, wherein a thermal polymerization inhibitor is further added in the stirring step.

14. A photosensitive resin composition comprising the photosensitive resin of Formula 1 according to claim 1,
f) a polymerizable compound having at least one ethylenically unsaturated bond,
g) a photopolymerization initiator, and
h) a solvent.

15. The composition according to claim 14, wherein the polymerizable compound f is selected from: compounds prepared by esterifying at least one polyhydric alcohol selected from ethylene glycol di(meth)acrylate, polyethylene glycol di(meth)) acrylate having 2 to 1.4 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethylphthalic acid, propylene glycol di(meth)acrylate having 2 to 14 propylene groups, dipentaerythritol penta(meth)acrylate and dipentaerythritol hexa(meth) acrylate with an α,β-unsaturated carboxylic acid; compounds prepared by adding (meth) acrylic acid to at least one glycidyl group-containing compound selected from trimethylolpropane triglycidyl ether acrylic acid adducts and bisphenol A diglycidyl ether acrylic acid adducts; ester compounds obtained from a compound having a hydroxyl group or an ethyl-enically unsaturated bond and a polyhydriccarboxylic acid, and adducts of a compound having a hydroxyl group or an ethylenically unsaturated bond with polyisocyanate, such as phthalic acid diester of β-hydroxyethyl(meth)acrylate and adduct of β-hydroxyethyl(meth)acrylate with toluene diisocyanate; alkyl (meth) acrylic acid esters, including methyl (meth)acrylate, ethyl (meth)acrylate, butyl (meth)acrylate and 2-ethylhexyl (meth) acrylate; 9,9'-bis[4-(2-acryloyloxyethoxy)phenyl]fluorene; and mixtures thereof.

16. The composition according to claim 14, wherein the photopolymerization initiator g) is selected from triazine compounds, biimidazole compounds, acetophenone compounds, O-acyloxime compounds, benzophenone compounds, thioxanthone compounds, phosphine oxide compounds, and coumarin compounds.

17. The composition according to claim 14, wherein the solvent h) is selected from methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxy propanol, 3-methoxy butanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, and mixtures thereof.

18. The composition according to claim 14, further comprising at least one additive selected from alkali-soluble acrylic copolymer resins, photosensitizers, colorants, curing accelerators, thermal polymerization inhibitors, plasticizers, adhesion promoters, fillers, and surfactants.

19. The composition according to claim 14, wherein the photosensitive resin composition comprises 1 to 20% by weight of the photosensitive resin, 0.5 to 30% by weight of the polymerizable compound f), 0.1 to 5% by weight of the photopolymerization initiator g) and 10 to 95% by weight of the solvent h), based on the total weight of the composition.

20. A cured product of the composition according to claim 14.

21. A cured product of the composition according to claim 15.

22. A cured product of the composition according to claim 16.

23. A cured product of the composition according to claim 17.

24. A cured product of the composition according to claim 18.

25. A cured product of the composition according to claim 19.

* * * * *